(12) United States Patent
Butler et al.

(10) Patent No.: US 8,717,532 B2
(45) Date of Patent: May 6, 2014

(54) ACTIVE MOUNT, LITHOGRAPHIC APPARATUS COMPRISING SUCH ACTIVE MOUNT AND METHOD FOR TUNING SUCH ACTIVE MOUNT

(75) Inventors: Hans Butler, Best (NL); Pieter Johannes Gertrudis Meijers, Horst (NL); Hendrikus Johannes Schellens, Bergeijk (NL)

(73) Assignee: ASML Netherlands B.V., Veldhoven (NL)

( * ) Notice: Subject to any disclaimer, the term of this patent is extended or adjusted under 35 U.S.C. 154(b) by 442 days.

(21) Appl. No.: 12/969,234

(22) Filed: Dec. 15, 2010

(65) Prior Publication Data
US 2011/0149265 A1 Jun. 23, 2011

Related U.S. Application Data

(60) Provisional application No. 61/288,963, filed on Dec. 22, 2009.

(51) Int. Cl.
*G03B 27/68* (2006.01)

(52) U.S. Cl.
USPC .......................................................... 355/52

(58) Field of Classification Search
USPC ................... 355/53, 72, 52; 310/338
See application file for complete search history.

(56) References Cited

U.S. PATENT DOCUMENTS

| | | | |
|---|---|---|---|
| 6,154,000 A | 11/2000 | Rastegar et al. | |
| 6,791,664 B2 | 9/2004 | Auer et al. | |
| 2002/0075574 A1 | 6/2002 | Sorg et al. | |
| 2002/0149754 A1 | 10/2002 | Auer et al. | |

(Continued)

FOREIGN PATENT DOCUMENTS

| | | |
|---|---|---|
| JP | 06-265438 | 9/1994 |
| JP | 2002-319543 | 10/2002 |
| JP | 2002-343712 | 11/2002 |
| JP | 2009-503826 | 1/2009 |

OTHER PUBLICATIONS

Holterman, J., "Active damping elements for improving the accuracy of a microlithography machine" Proc. SPIE Smart Structures and Materials, Industrial and Commercial Applications of Smart Structures Technologies, 2004, vol. 5388, pp. 20-31.

(Continued)

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

A lithographic apparatus includes an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate. The projection system is mounted on a reference structure of the lithographic apparatus by a mount of the lithographic apparatus. The mount includes a first piezoelectric element to exert a force on the projection system, a second piezoelectric element to measure the force, and an interconnection member interposed between the first and second piezoelectric elements, the interconnection member comprising a cut.

17 Claims, 7 Drawing Sheets

(56) References Cited

U.S. PATENT DOCUMENTS

| | | |
|---|---|---|
| 2004/0178354 A1 | 9/2004 | Visscher |
| 2008/0006759 A1 | 1/2008 | Heiland |
| 2008/0285161 A1* | 11/2008 | Geuppert et al. ............. 359/819 |
| 2012/0154774 A1* | 6/2012 | Van Der Wijst et al. ........ 355/53 |
| 2012/0194795 A1* | 8/2012 | Rau et al. ........................ 355/67 |

OTHER PUBLICATIONS

Holterman, J.,"Active damping based on decoupled collocated control" Proc. International Symposium on Active Control of Sound and Vibration, 2002, pp. 827-838.

European Search Report in related application No. EP 10 19 6309 dated Apr. 8, 2011.

* cited by examiner

ACTIVE MOUNT, LITHOGRAPHIC APPARATUS COMPRISING SUCH ACTIVE MOUNT AND METHOD FOR TUNING SUCH ACTIVE MOUNT

CROSS REFERENCE TO RELATED APPLICATIONS

This application claims priority and benefit under 35 U.S.C. §119(e) to U.S. Provisional Patent Application No. 61/288,963, entitled "Active Mount, Lithographic Apparatus Comprising Such Active Mount and Method For Tuning Such Active Mount", filed on Dec. 22, 2009. The content of that application is incorporated herein in its entirety by reference.

FIELD

The present invention relates to an active mount, a lithographic apparatus including such active mount and a method for tuning such active mount.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, many moving parts may be provided. Movements may for example be performed by a substrate stage, a patterning device stage (e.g. a mask stage), cooling devices, etc. These movements may result in vibrations or other disturbances which may act on a projection system of the lithographic apparatus (also referred to as projection lens or lens). Thereby, vibrations or other disturbances of the projection system as a whole, and/or of optical elements thereof, may occur. Previously, an active lens mount has been devised in order to reduce an effect of such vibrations. In such active lens mount, a first piezo element is provided to exert a force on the projection system, and a second piezo element to measure the force. Using a suitable control system, a resulting force on the projection system may be reduced.

SUMMARY

It is desirable to provide an improved active mount.

According to an embodiment of the invention, there is provided a mount to hold an object, including: a first piezoelectric element to exert a force on the object, a second piezoelectric element to measure the force, and an interconnection member interposed between the first and second piezoelectric elements, the interconnection member including a cut.

In another embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, the projection system being mounted to a reference structure of the lithographic apparatus by a mount of the lithographic apparatus, the mount including: a first piezoelectric element to exert a force on the projection system, a second piezoelectric element to measure the force, and an interconnection member interposed between the first and second piezoelectric elements, the interconnection member including a cut.

In an further embodiment of the invention, there is provided a method for tuning a mount, the mount to hold an object and including: a first piezoelectric element to exert a force on the object, a second piezoelectric element to measure the force, and an interconnection member interposed between the first and second piezoelectric elements, the method including repeating (a) measuring a remaining cross talk of the mount, and (b) cutting into the interconnection member, until the remaining crosstalk reaches a predetermined level.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
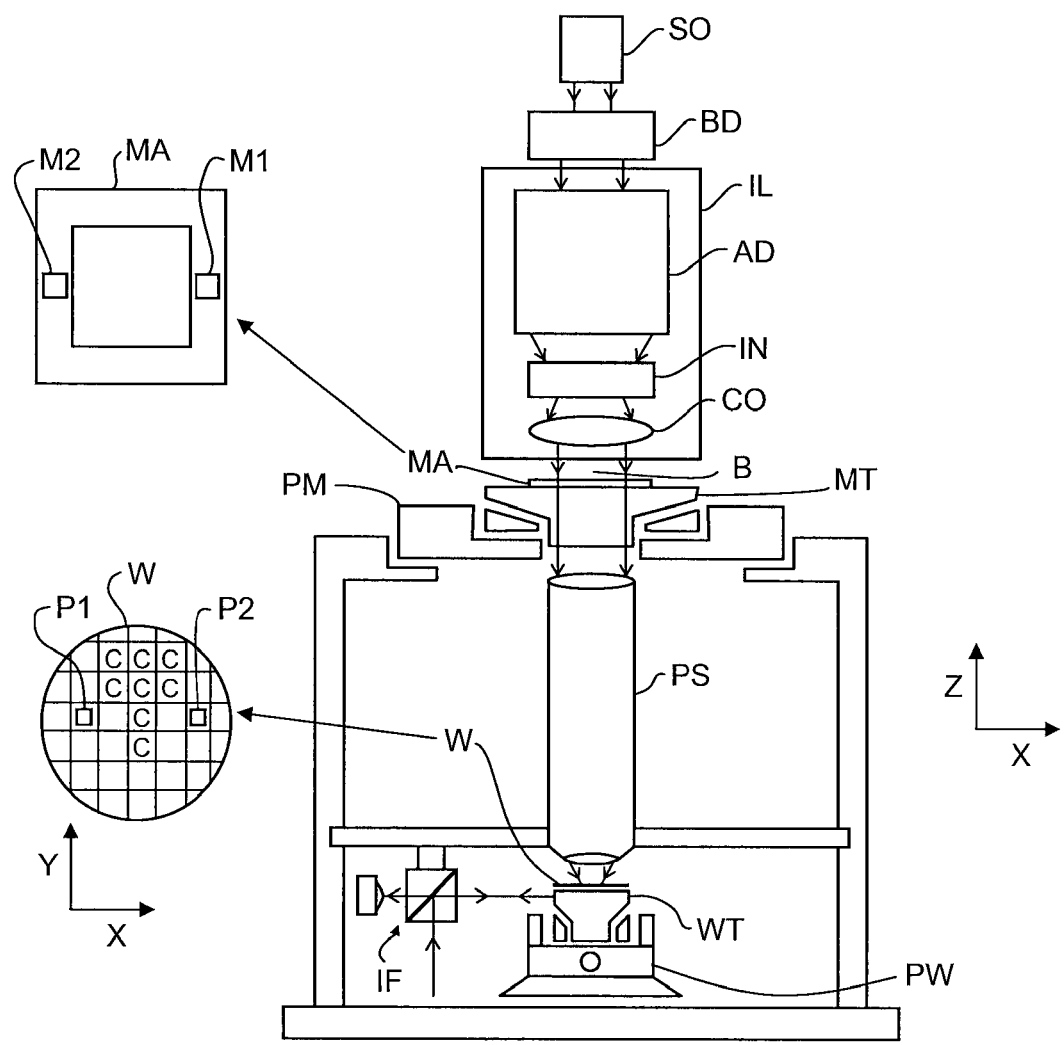
FIG. 1 depicts a lithographic apparatus in which an embodiment of the invention may be employed.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
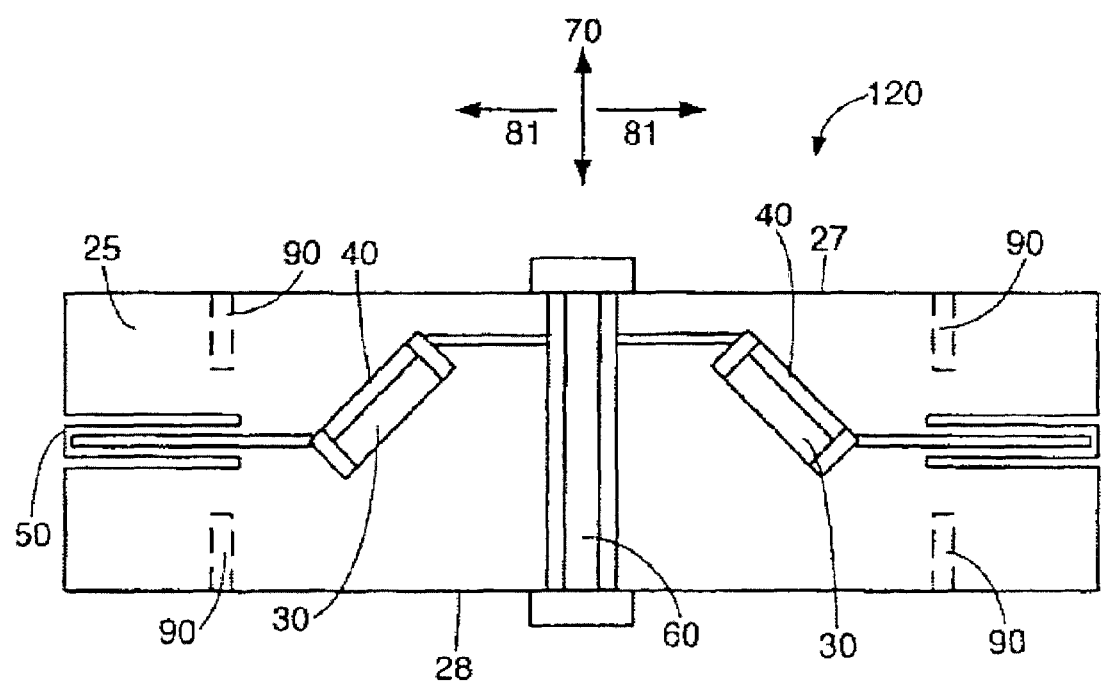
FIG. 2 depicts a piezo active lens mount as presently applied in a lithographic apparatus according to an embodiment of the invention.

An embodiment of an active lens mount is depicted in FIG. 2. FIG. 2 depicts an active lens mount (also referred to as active mount) having a top part with a top surface 27 and a bottom part with a bottom surface 28. The top part and bottom part are interconnected by resilient structures 50 at both sides. Furthermore, the top part (identified by 25) and bottom part are interconnected by piezoelectric actuator-sensor combinations, identified in FIG. 2 as 30, 40. Each of the actuator-sensor combinations includes a piezoelectric element acting as an actuator and a piezoelectric element acting as a sensor. By driving the actuator with a suitable electric signal, an expansion of the piezoelectric actuator element may be achieved. A required force acting via the piezoelectric elements 30, 40 between the top part and the bottom part may be derived from a signal obtained from the piezoelectric sensor 40. A suitable control system (broadly termed "controller") may be provided to drive each of the actuators 30, thereby taking into account a respective signal obtained from the corresponding sensor 40, so as to counteract vibrations, disturbances etc. having an effect on the top part 25. In an embodiment, 3 of such depicted active lens mounts may be used. The projection system PS (as depicted in FIG. 1) may hence be mounted on 3 lens mounts as depicted. As each lens mount enables to generate forces in two directions (in this example for example the directions 70 and 81 as indicated in FIG. 2), a correction in multiple degrees of freedom, preferably in 6 degrees of freedom, may be provided thereby. It is noted that FIG. 2 further depicts attachment holes 90 provided in the top part and bottom part so as to enable the active lens mount to be adequately fastened. Furthermore, a compression bolt 60 may be provided to press the top and bottom surfaces 27, 28 together. Such compression bolt may however in other embodiments be omitted, as a compression force may already be provide by the weight of the projection system itself.

Figure 3:
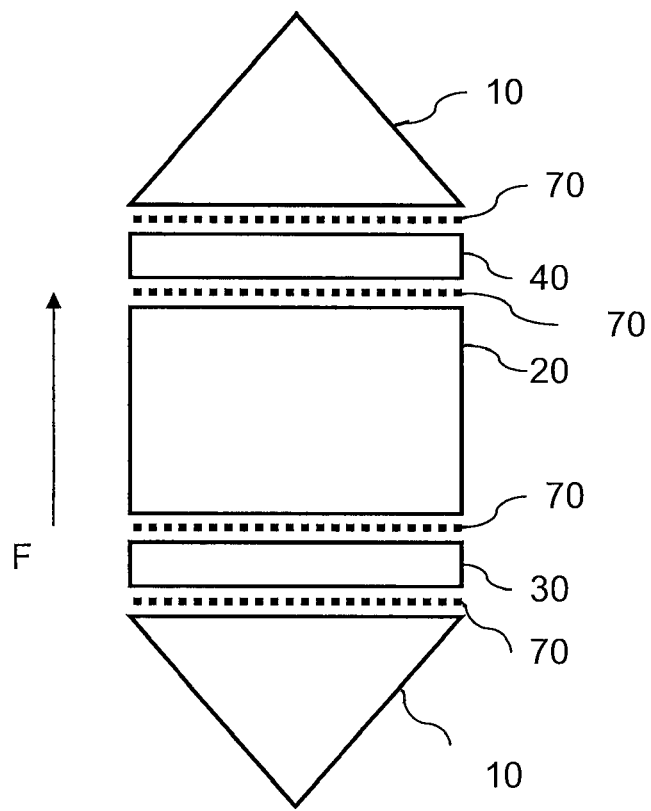
FIG. 3 depicts a piezo stack of such piezo active mount according to an embodiment of the invention.

A more detailed, however still schematic view of an embodiment of the piezo actuator-sensor combination is depicted in FIG. 3. In this embodiment, a stack is provided including the piezoelectric sensor 30, the piezoelectric actuator 40, and an interconnection member 20 to interconnect the actuator 30 and sensor 40. Respective mounts, with which the sensor actuator assembly is connected to the bottom and top part are referred to in FIG. 3 by reference numeral 10. The identified items are interconnected by gluing, respective glue layers being schematically indicated in FIG. 3 and identified by reference numeral 70.

A piezoelectric actuator includes a crystal structure which, when applying an electrical voltage to it, will result in a force in the direction F as referred to in FIG. 3 (whether the force in the direction as depicted is positive or negative depends on a polarity of the applied voltage, as, depending on the polarity of the applied voltage, the piezo material will exhibit a tendency to expand or a tendency to contract) which may result in an expansion or contraction, and a corresponding increase/decrease of the dimension of the actuator 30 in this direction. When deforming however, the piezoelectric element does not only increase or decrease its dimension along the direction F, however also a deformation along a width of the actuator may occur. This deformation will, via the glue 70, result in a deformation of the interconnection member 20. Ideally, the sensor 40 would only sense forces acting on the assembly of actuator 30, sensor 40 and interconnection member 20 along the direction F, however the deformation of the actuator 30, and consequential deformation of the interconnection member 20, will result in a deformation of a contacting surface where the interconnection member 20 contacts, via the glue layer 70, the sensor 40. As a consequence, a signal will be generated by the sensor 40 in response to such deformations, hence resulting in a crosstalk. This behavior results in a frequency response of the sensor 40 as depicted FIG. 4 (continuous lines, the dashed lines will be referred to later). Along a horizontal axis of FIG. 4, a frequency scale is provided. Along a vertical axis, in the upper part, a magnitude of the transfer is provided, while along the vertical axis, in the lower part, the phase PH of the transfer is depicted. As can be seen, for relatively high frequencies, in this example above 100 Hz, the projection system will remain quasi stationary, and therefore a drive of the actuator will linearly result in a measurement by the sensor. In an ideal case, for very low frequencies, approaching zero, the magnitude of the transfer would ideally be zero, as a constant drive of the actuator will result in a displacement of the projection system, which will, after the displacement has settled, provide a substantially zero output at the sensor. Hence, in the stationary case, a transfer of zero would ideally be expected, which results in an ideal transfer frequency characteristic substantially in a quadratic relation with a frequency in a certain frequency range. At low frequencies however, another effect may play an important role, namely the deformation described with reference to FIG. 3. This deformation will, at low frequencies, result in a transfer because of the above described crosstalk that takes place as a result of the deformation of the interconnection member 20.

Figure 4:
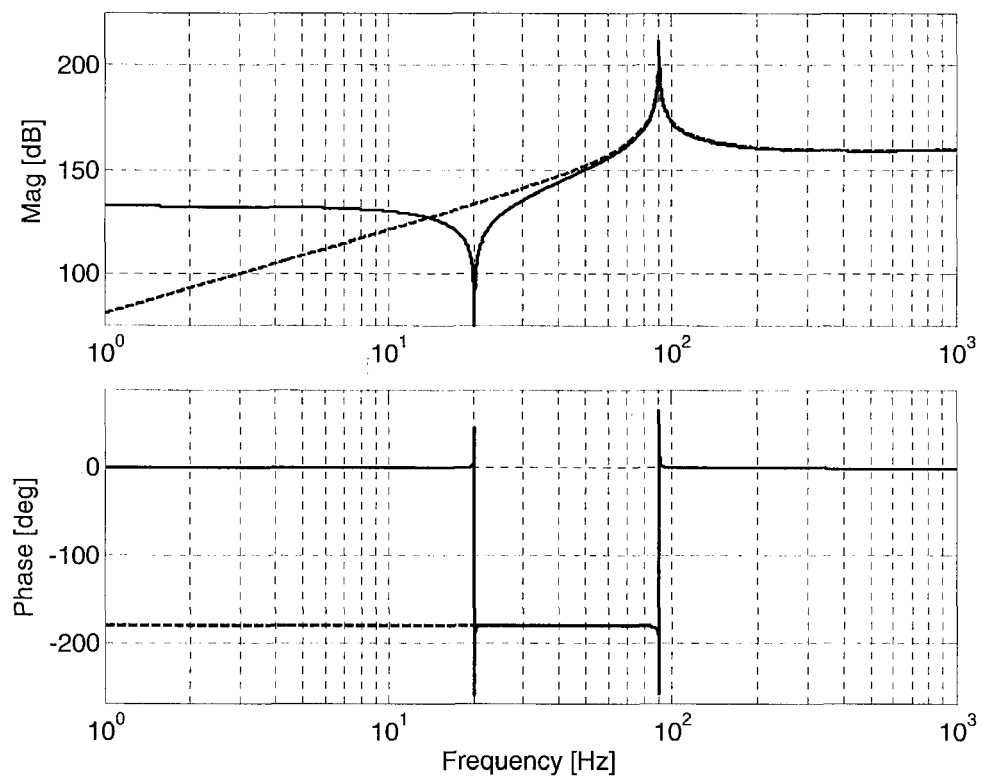
FIG. 4 depicts a frequency response of such piezo stack.

As a result, a frequency characteristic as depicted in FIG. 4 is obtained, having a flat response for low frequencies, followed by a response quadratically depending on the frequency, again followed by a flat response for higher frequencies.

Figure 5A:
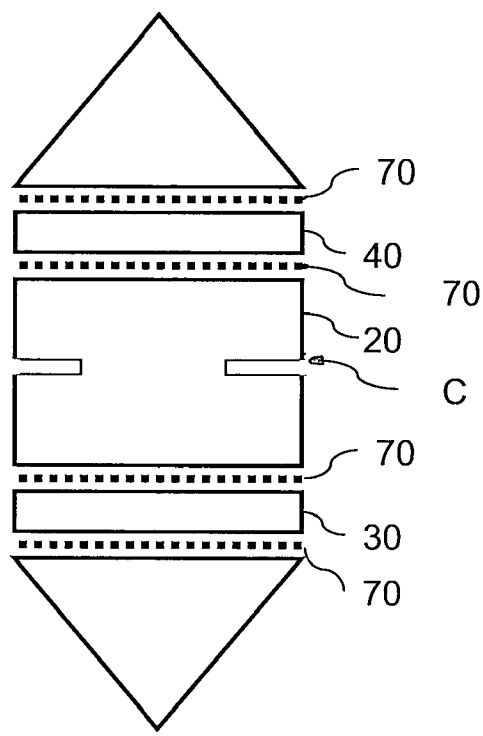
FIG. 5A-E depict a piezo stack of an active lens mount according to embodiments of the invention.

In an embodiment, the interconnection member may be provided with a cut C which may reduce a crosstalk from the actuator 30 to the sensor 40. A variety of embodiments of such cut will be described with reference to FIGS. 5A-5E. In general, the cut may assist to reduce a crosstalk, as a resulting deformation of the interconnection member 20 at its side facing the sensor 40, the deformation as a result of the actuation and deformation of the actuator 30. Generally, the cut aims at maintaining a high stiffness in the direction of the force F, while reducing or better dividing a deformation of the face of the interconnection member which is glued to the sensor. In an embodiment, a reduction of the crosstalk may be obtained in two ways: firstly, a deformation of the surface to which the sensor is connected, may be reduced. Secondly, a reduction in crosstalk also occurs when positive and negative effects of deformation substantially compensate each other. As an example, a compression of the piezo electric sensor 40 in vertical direction and an expansion thereof in the same direction results in opposite electrical charges. In case, as a result of deformation, a part of the sensor is compressed while another part of the sensor is extended in the same direction, resulting positive and negative charges may at least partly compensate each other, thereby reducing an output of the sensor as a result of such deformation. Making use of one or both of these effects, a plurality of embodiments have been devised, which will be described below with reference to FIGS. 5A-5E. In FIG. 5A, the interconnection member has been provided with a lateral cut in a plane substantially perpendicular to a direction of the force. Thereby, a stiffness in the direction of the force (in FIGS. 5A-E the vertical direction) is maintained, while a deformation may be reduced. In this embodiment, lateral cuts are provided at the opposite side of the interconnection member, thereby providing a degree of symmetry, which enables to improve cancelling a positive and negative charges which are due to extraction and contraction of parts of the piezo electric sensor. It has been devised that a depth of the cuts is beneficially set in a range so as to leave a remaining part of the interconnection member between the cuts to have a width in a range from 40% to 80% of the total width of the interconnection member.

Figure 5B:
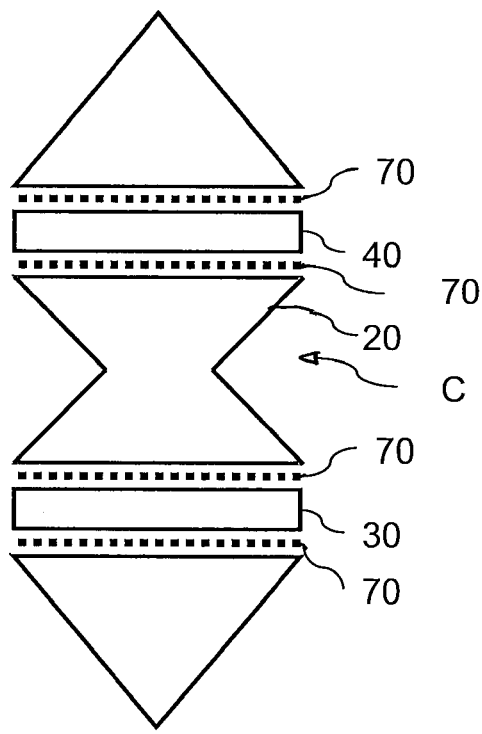

Another example is schematically depicted in FIG. 5B. Here, the interconnection member is provided with a triangular cut. The same remarks as made further to the FIG. 5A embodiment also apply here. Comparing the embodiments in accordance with FIGS. 5A and 5B, a similar stiffness in the direction of the force may be observed, however differences in their deformation behavior may be observed: In the embodiment in accordance with FIG. 5A, an upper and lower part of the interconnection member (i.e. on both sides of the cut) may exhibit a higher bending stiffness and exhibit a different behavior in transverse contraction.

Figure 5C:
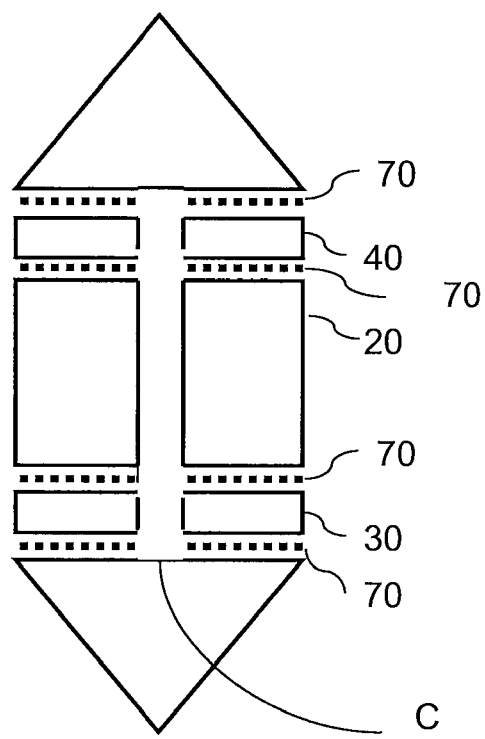

A still further embodiment is shown in FIG. 5C, where the cut extends along the direction of the force i.e. in FIG. 5C in vertical direction, thereby in this example not only dividing the interconnection member in parts, but also the first and second piezoelectric elements. Alternatively, the cut may extend only through the interconnection member, thereby leaving the piezoelectric elements each as an integral part. As a result, smaller interconnection members and smaller piezoelectric elements are provided, thereby resulting in a lower deformation effect. In an embodiment, the interconnection member as well as the first and second piezoelectric elements are divided in 4 parts, the cuts hence being provided in planes substantially perpendicular to each other.

Figure 5D:
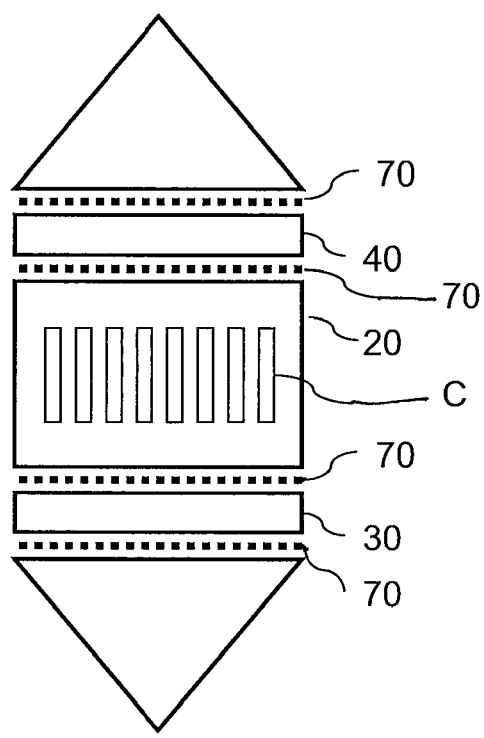
Figure 5E:
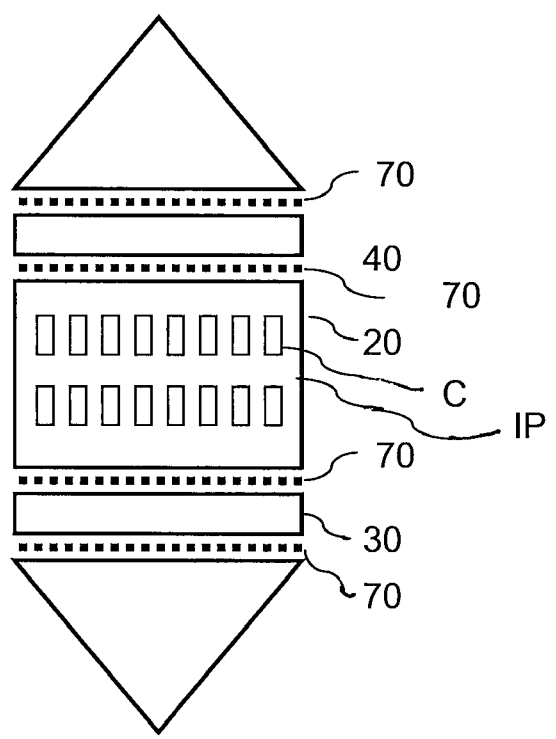

In a still further embodiment, a plurality of parallel cuts is provided. Thereby, similarly to the other embodiments, a stiffness in the direction of the force may be maintained, while crosstalk may be reduced. The parallel cuts may be provided along to planes, the planes preferably being substantially perpendicular to each other, so as to form a structure of poles in an intermediate part of the interconnection member. A variant to the embodiment depicted in FIG. 5D is depicted in FIG. 5E. Here, double cuts are provided thereby leaving an interconnection plate IP between the poles.

Benefits of the interconnection member having a cut may in general be that a crosstalk between the first piezoelectric element (i.e. the piezoelectric actuator) and the second piezoelectric element (i.e. the piezoelectric sensor) is reduced. Specific benefits may be achieved with the various embodiments in accordance with FIGS. 5A-5E. The various embodiments may exhibit differences in bending stiffness, lateral stiffness and stiffness in the direction of the force (i.e. the actuation direction of the first piezoelectric element). Differences between the embodiments according to FIGS. 5A and 5B have been described above. In the embodiment in accordance with FIG. 5C, a width-height ratio of the interconnection member is changed, whereby stiffness may be maintained at a same level. This may provide benefit in circumstances where a low height of the interconnection member is to be achieved. The embodiment in accordance with FIG. 5D may provide for an interconnection member having a relatively low stiffness in lateral direction (i.e. in a direction substantially perpendicular to the direction of the force: in such a configuration, when a length/width ratio of the remaining "poles" would be to high and risk bending, the embodiment in accordance with FIG. 5E would increase/reduce such a bending risk). Hence, the difference embodiments may be applied to tailor a behavior of the interconnection member to a specific need.

In an embodiment, the crosstalk may be dimensioned so as to reach a certain level which is substantially opposite to a crosstalk provided via the resilience 50 depicted in FIG. 2. As a result, crosstalk obtained via the interconnection member and crosstalk obtained via the parallel resilience 50 of the active lens mount, may be substantially opposite, which may result in a substantial reduction of an overall crosstalk, hence in an improved effectiveness of the active lens mount.

In a further embodiment, a deformation member may be provided in the interconnection member, the deformation member may be formed, for example, by a piezoelectric actuator. Thereby, an active fine tuning may be provided as a remaining crosstalk may be reduced by a suitable deformation of interconnection member. Furthermore, an actuator, such as a piezoelectric actuator may be provided to act on the parallel resilience 50, thereby amending a stiffness thereof to certain degree. As a result, a fine tuning may be obtained as a stiffness of the parallel resilience, and hence a crosstalk via the parallel resilience between the first and second piezoelectric element, may be adjusted to be substantially equal but opposite to the crosstalk via the deformation of the interconnection member, thereby substantially reducing an overall crosstalk.

As a result of the various embodiments of the invention, a crosstalk of the interconnection member may be reduced, which may as an example result in a change in the frequency characteristic in accordance with the dashed lines depicted in FIG. 4, whereby for lower frequencies, the quadratic relation with frequency remains, as indicated by the dashed lines.

In each of the above embodiments, a tuning may be obtained by assembling an active lens mount of a lithographic apparatus, measuring a crosstalk of the active lens mount, the crosstalk between the first piezoelectric element and the second piezoelectric element, and cutting into the interconnection member (e.g. in accordance with any of the embodiments depicted and described with reference to FIGS. 5A-5E), until the crosstalk reaches a predetermined level. Thereby, an adjustment may be made to take account of a variety of factors that could have an effect on the remaining crosstalk, such as manufacturing tolerances, differences in weight of the projection system, and other factors. A similar iterative improvement may also be performed in a finite element computer simulation without actually manufacturing or mechanically processing a series of active lens mounts. The above described concept may not only be applied for an active lens mount of a lithographic apparatus. It will be understood that the same concept may be applied to any application hence may be applied to any active mount.

Although in the above, reference has been made to application is a lithographic apparatus, it will be understood that the piezoelectric active mount may be applied for many other applications, some examples of which being provided below: The piezoelectric active mount in accordance with the invention may for example be applied in:

a vibration damper of a turning machine, a polishing mashing, a cutter machine, a lapping machine, etc for accurate manufacturing of parts, such as mechanical parts of optical parts. Therefore, the mount may be applied to mount such a machine and/or the to be machined product.

a vibration damper of an optical target which is located in an imaging plane, focal plane etc. of a projection system. Examples may include a substrate or substrate table in a lithographic apparatus, scanning electron microscope etc.

a vibration damper of a dish antenna telescope etc.

in applications where parts are to be accurately aligned is respect of each other, an application thereof may for example be found in a particle accelerator.

The above examples should not be considered limitative. Rather, the mount as described in this document may be applied in any vibration damping application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A mount to hold an object, the mount comprising:
   a first piezoelectric element configured to exert a force on the object;
   a second piezoelectric element configured to measure the force, and
   an interconnection member interposed between the first and second piezoelectric elements, the interconnection member comprising a cut,
   wherein the cut is dimensioned to provide for a desired cross talk between the first piezoelectric element and the second piezoelectric element, and
   wherein the desired cross talk is substantially opposite to a cross talk between the first piezoelectric element and the second piezoelectric element caused by a parallel resilience of the mount so as to reduce said cross talk.

2. The mount of claim 1, wherein the cut comprises a lateral cut in a plane substantially perpendicular to a direction of the force.

3. The mount of claim 2, wherein lateral cuts are provided at opposite sides of the interconnection member.

4. The mount of claim 3, wherein a depth of the cuts is dimensioned so that a remaining part of the interconnection members between the cuts has a width in a range from about 40% to 80% of a width of the interconnection member.

5. The mount of claim 2, wherein the cut comprises a triangular cut.

6. The mount of claim 5, wherein the cut is provided at opposite sides of the interconnection member.

7. The mount of claim 5, wherein a depth of the cuts is dimensioned so that a remaining part of the interconnection members between the cuts has a width in a range from about 40% to 80% of a width of the interconnection member.

8. The mount of claim 1, wherein the cut extends along a direction of the force.

9. The mount of claim 8, wherein two cuts are provided in planes substantially perpendicular to each other.

10. The mount of claim 9, wherein the cuts extend through the first and second piezoelectric elements, thereby dividing the interconnection member and the first and second piezoelectric elements in 4 parts.

11. The mount of claim 9, wherein a plurality of parallel cuts are provided along the planes, so as to form poles in a part of the interconnection member.

12. The mount of claim 11, wherein, seen along the direction of the force, double cuts are provided, the double cuts leaving an interconnection plate between the poles.

13. The mount of claim 1, wherein a deformation member, such as a piezoelectric actuator, is comprised in the interconnection member, the deformation member configured to deform the interconnection member.

14. The mount of claim 1, wherein an actuator is provided to change a stiffness of the parallel resilience.

15. The mount of claim 14, wherein the actuator is a piezoelectric actuator.

16. A lithographic apparatus comprising:
 an illumination system configured to condition a radiation beam;
 a support constructed to support a patterning device, the patterning device being capable of imparting the radiation beam with a pattern in its cross-section to form a patterned radiation beam;
 a substrate table constructed to hold a substrate;
 a projection system configured to project the patterned radiation beam onto a target portion of the substrate, the projection system being mounted on a reference structure of the lithographic apparatus by a mount of the lithographic apparatus, the mount comprising
 a first piezoelectric element configured to exert a force on the projection system, a second piezoelectric element configured to measure the force, and
 an interconnection member interposed between the first and second piezoelectric elements, the interconnection member comprising a cut,
 wherein the cut is dimensioned to provide for a desired cross talk between the first piezoelectric element and the second piezoelectric element, and
 wherein the desired cross talk is substantially opposite to a cross talk between the first piezoelectric element and the second piezoelectric element caused by a parallel resilience of the mount so as to reduce said cross talk.

17. A method for tuning a mount, the mount to hold an object and comprising a first piezoelectric element configured to exert a force on the object, a second piezoelectric element configured to measure the force, and an interconnection member interposed between the first and second piezoelectric elements, the method comprising repeating (a) measuring a remaining cross talk of the mount, and (b) cutting into the interconnection member, until the remaining crosstalk reaches a desired level.

* * * * *